United States Patent
Horiguchi et al.

(10) Patent No.: US 8,558,123 B2
(45) Date of Patent: Oct. 15, 2013

(54) ELECTRONIC COMPONENT DEVICE WITH A NI-BI ALLOY SEALING FRAME

(75) Inventors: Hiroki Horiguchi, Nagaokakyo (JP); Yuji Kimura, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 122 days.

(21) Appl. No.: 13/026,540

(22) Filed: Feb. 14, 2011

(65) Prior Publication Data

US 2011/0132656 A1 Jun. 9, 2011

Related U.S. Application Data

(63) Continuation of application No. PCT/JP2009/064156, filed on Aug. 11, 2009.

(30) Foreign Application Priority Data

Aug. 21, 2008 (JP) .................................. 2008-212471

(51) Int. Cl.
*H01R 13/46* (2006.01)

(52) U.S. Cl.
USPC ......................................................... 174/520

(58) Field of Classification Search
USPC ......................................................... 174/520
See application file for complete search history.

(56) References Cited

U.S. PATENT DOCUMENTS

| | | | |
|---|---|---|---|
| 7,065,867 B2 | 6/2006 | Kim et al. | |
| 7,138,293 B2 * | 11/2006 | Ouellet et al. | 438/106 |
| 7,259,032 B2 | 8/2007 | Murata et al. | |
| 7,669,752 B2 * | 3/2010 | Ikeda et al. | 228/180.21 |
| 8,038,739 B2 * | 10/2011 | Ellis et al. | 29/623.4 |
| 2003/0015575 A1 * | 1/2003 | Yamaguchi et al. | 228/248.1 |
| 2005/0221634 A1 * | 10/2005 | Hilty et al. | 439/70 |
| 2006/0113683 A1 * | 6/2006 | Dean et al. | 257/783 |
| 2006/0246304 A1 * | 11/2006 | Ishihara et al. | 428/446 |
| 2009/0129971 A1 * | 5/2009 | Riedl | 420/577 |
| 2010/0246148 A1 * | 9/2010 | Ikeda et al. | 361/760 |
| 2011/0132655 A1 * | 6/2011 | Horiguchi et al. | 174/520 |

FOREIGN PATENT DOCUMENTS

| | | |
|---|---|---|
| JP | 2003-243550 A | 8/2003 |
| JP | 2004194290 A | 7/2004 |
| JP | 2006-108162 A | 4/2006 |
| JP | 2006-135264 A | 5/2006 |

OTHER PUBLICATIONS

PCT/JP2009/064156 Written Opinion dated Aug. 26, 2009.

* cited by examiner

*Primary Examiner* — Timothy Thompson
*Assistant Examiner* — Nathan Milakovich
(74) *Attorney, Agent, or Firm* — Dickstein Shapiro LLP

(57) ABSTRACT

An electronic component device having a first sealing frame formed on a main substrate and a second sealing frame formed on a cover substrate, the first and second sealing frames being composed of a Ni film. A bonding section constituted by a Ni—Bi alloy is formed between the first and second sealing frames. For example, a Bi layer is formed on the first sealing frame, and then the first sealing frame and the second sealing frame are heated at a temperature of 300° C. for at least 10 seconds while applying pressure in the direction in which the first sealing frame and the second sealing frame are in close contact with each other, and thus the bonding section, which bonds the first sealing frame to the second sealing frame, is formed.

11 Claims, 5 Drawing Sheets

ELECTRONIC COMPONENT DEVICE WITH A NI-BI ALLOY SEALING FRAME

CROSS REFERENCE TO RELATED APPLICATIONS

The present application is a continuation of International Application No. PCT/JP2009/064156, filed Aug. 11, 2009, which claims priority to Japanese Patent Application No. JP2008-212471, filed Aug. 21, 2008, the entire contents of each of these applications being incorporated herein by reference in their entirety.

FIELD OF THE INVENTION

The present invention relates to an electronic component device and a method for manufacturing the same, and particularly to an electronic component device having a structure of bonding sealing frames to each other for hermetic sealing, and a method for manufacturing the same.

BACKGROUND OF THE INVENTION

Electronic component devices of interest to the present invention include, for example, a BAW filter. The BAW filter includes a main substrate provided with an electronic circuit forming section and a first sealing frame surrounding the electronic circuit forming section on one main surface of the main substrate, and a cover substrate provided with a second sealing frame to be bonded to the first sealing frame on one main surface of the cover substrate. Then, the main substrate and the cover substrate are disposed so that the main surfaces of the two substrates face each other, and in this state, the first sealing frame and the second sealing frame are bonded to each other to realize a structure in which the above-mentioned electronic circuit forming section is hermetically sealed.

The following technologies have been proposed as a technology for bonding the first sealing frame and the second sealing frame to each other to seal an electronic component device as described above.

First, a sealing technology based on a Cu—Sn alloy has been proposed in Japanese Unexamined Patent Publication No. 2004-194290 (Patent Document 1) and Japanese Unexamined Patent Publication No. 2006-135264 (Patent Document 2). This sealing technology will be described with reference to FIG. 7.

In FIG. 7, a part of each of a main substrate 1 and a cover substrate 2, which are disposed so as to face each other, is shown. As shown in FIG. 7(1), a first sealing frame 3 is formed on an upper main surface of the main substrate 1, and on the other hand, a second sealing frame 4 is formed on a lower main surface of the cover substrate 2 before a bonding step is performed. The first and second sealing frames 3 and 4 are composed of, for example, copper (Cu). An oxidation resistant film 5 composed of Au, for example, is formed on the first sealing frame 3 as required as shown by the dotted line. The oxidation resistant film 5 is a film for preventing the oxidation of Cu constituting the first sealing frame 3, and does not contributes directly to bonding described later. On the other hand, a Sn layer 6 predominantly composed of Sn having a lower melting point than Cu is formed on the second sealing frame 4. The Sn layer 6 functions as a bonding material.

In order to attain a state in which the first sealing frame 3 is bonded to the second sealing frame 4, the first sealing frame 3 and the second sealing frame 4 are brought into a contact state, in which the two frames face each other with the Sn layer 6 interposed therebetween, by applying pressure, and the first sealing frame 3 and the second sealing frame 4 are heated while maintaining the contact state. Consequently, first, Au constituting the oxidation resistant film 5 is dissolved in the Sn layer 6, and then, Cu constituting the first and second sealing frames 3 and 4 diffuses into the Sn layer 6 to produce an intermetallic compound of Cu and Sn.

More specifically, when heating in pressurization as described above is continued, the Sn layer 6 disappears, and first, a $Cu_6Sn_5$ layer 7 predominantly composed of $Cu_6Sn_5$ having a melting point of 415° C. is formed as shown in FIG. 7(2), and a $Cu_3Sn$ layer 8 predominantly composed of $Cu_3Sn$ having a melting point of 640° C. begins to be formed between the $Cu_6Sn_5$ layer 7 and each of the first sealing frame 3 and the second sealing frame 4.

When the heating in pressurization is further continued, the $Cu_6Sn_5$ layer 7 disappears as shown in FIG. 7(3), and a bonding structure, in which a bonding section 9 bonding the first sealing frame 3 to the second sealing frame 4 is constituted by the $Cu_3Sn$ layer 8, is attained.

In the bonding structure as describe above, it is important that the $Cu_6Sn_5$ layer 7 disappears and the bonding section 9 is constituted by the $Cu_3Sn$ layer 8. The reason for this is that if the $Cu_6Sn_5$ layer 7 remains, the interdiffusion between Cu and Sn further proceeds so that the $Cu_6Sn_5$ layer 7 will change to the $Cu_3Sn$ layer 8 when the bonding section 9 is exposed to used reflow or high-temperature environment for a long time, and so-called Kirkendall voids may be generated due to difference in diffusion coefficients between Cu and Sn during the interdiffusion proceeds to cause defective sealing.

In order to attain a state in which the $Cu_6Sn_5$ layer 7 disappears and the bonding section 9 is constituted by the $Cu_3Sn$ layer 8, it is necessary to diffuse Cu adequately into Sn, but the alloy growth rate of $Cu_3Sn$ is extremely small as shown in FIG. 8. In addition, FIG. 8 shows the growth rates of alloys at 300° C. Therefore, in order to attain a state in which the bonding section 9 is constituted by the $Cu_3Sn$ layer 8, for example, the condition that a temperature of 300° C. is held for 60 minutes under a pressure of 8.2 Mpa is required. Therefore, this process leads to a problem that productivity is low and production cost is high. Further, the above-mentioned conditions may be extreme conditions of impairing the quality of the electronic circuit forming section included in the electronic component device.

Patent Document 1: Japanese Unexamined Patent Publication No. 2004-194290
Patent Document 2: Japanese Unexamined Patent Publication No. 2006-135264

SUMMARY OF THE INVENTION

Thus, it is an object of the present invention to provide an electronic component device capable of solving the above-mentioned problems and a method for manufacturing the same.

The present invention is first directed to a structure of an electronic component device including a main substrate provided with an electronic circuit forming section and a first sealing frame surrounding the electronic circuit forming section on one main surface of the main substrate, a cover substrate provided with a second sealing frame to be bonded to the first sealing frame on one main surface of the cover substrate, and a bonding section which bonds the first sealing frame to the second sealing frame, and in order to solve the above technical problems, the present invention has a feature that each of the first sealing frame and the second sealing frame is made of a Ni film predominantly composed of Ni and the bonding section is constituted by a Ni—Bi alloy predominantly composed of Ni and Bi.

It is preferred that the Ni—Bi alloy is NiBi.

Further, the Ni—Bi alloy may contain $NiBi_3$.

In a preferred embodiment of the electronic component device of the present invention, a first connecting electrode is formed at a location, surrounded by the first sealing frame, on the one main surface of the main substrate and a second connecting electrode is formed at a location, surrounded by the second sealing frame, on the one main surface of the cover substrate, and an electrically connecting section electrically connecting the first connecting electrode to the second connecting electrode is disposed and the electrically connecting section has a constitution similar to that of the bonding section.

The present invention is also directed to the method for manufacturing the electronic component device as described above.

The method for manufacturing an electronic component device of the present invention has a feature that the method includes the steps of preparing a main substrate provided with an electronic circuit forming section and a first sealing frame surrounding the electronic circuit forming section on one main surface of the main substrate, in which the first sealing frame is made of a Ni film predominantly composed of Ni; preparing a cover substrate provided with a second sealing frame to be bonded to the first sealing frame on one main surface of the cover substrate, in which the second sealing frame is made of a Ni film predominantly composed of Ni; and heating and bonding for forming a bonding section constituted by a Ni—Bi alloy predominantly composed of Ni and Bi, which bonds the first sealing frame to the second sealing frame by being the first sealing frame and the second sealing frame in close contact with each other and heating the first and second sealing frames with a Bi layer predominantly composed of Bi interposed between the first sealing frame and the second sealing frame.

In a preferred embodiment of the method for manufacturing an electronic component device of the present invention, pressure is applied in the direction in which the first sealing frame and the second sealing frame are in close contact with each other in the heating and bonding step.

It is preferred that the heating and bonding step is performed so as to form the bonding section constituted by NiBi.

Alternatively, the heating and bonding step may be performed so as to form the bonding section containing $NiBi_3$.

In a preferred embodiment of the method for manufacturing an electronic component device of the present invention, a first connecting electrode is formed at a location, surrounded by the first sealing frame, on the one main surface of the main substrate and a second connecting electrode is formed at a location, surrounded by the second sealing frame, on the one main surface of the cover substrate, and the step of electrically connecting the first connecting electrode to the second connecting electrode is performed concurrently with performing the heating and bonding step.

In the above preferred embodiment, it is preferred that a dimension in the width direction of at least one of the first sealing frame and the second sealing frame is larger than a dimension in the width direction of the Bi layer.

In the method for manufacturing an electronic component device of the present invention, the Bi layer is formed on any one of the first sealing frame and the second sealing frame prior to the heating and bonding step.

In accordance with the present invention, since the Ni—Bi alloy formed at the bonding section has a rapid growth rate as compared with $Cu_3Sn$ described above, the bonding section can be formed in a short time and production cost can be reduced. Since a time for heating and bonding can be shortened, a thermal load on the electronic component device can be reduced and therefore, it becomes possible to apply the present invention to electronic component devices which are vulnerable to a high-temperature load.

Further, in accordance with the present invention, it is possible to prevent the alloy formed at the bonding section from melting, for example, in a solder reflow step since the Ni—Bi alloy has a relatively high melting point, for example, 469° C. for $NiBi_3$ and 654° C. for NiBi. Accordingly, the hermeticity of the electronic component device is not impaired even after the solder reflow step.

In the present invention, when the bonding section is formed so as to be constituted by NiBi, a bonding section, which is highly resistant to plastic fatigue failure due to repeated stress, can be attained.

On the other hand, in order to allow all the bonding section to be constituted by NiBi as described above, a longer heating holding time is required in the heating and bonding step, but if the bonding section is formed so as to contain $NiBi_3$, the heating holding time in the heating and bonding step can be shortened.

When the electronic component device of the present invention includes the first and second connecting electrodes, if the first connecting electrode is electrically connected to the second connecting electrode concurrently with performing the heating and bonding step on the first sealing frame and the second sealing frame, sealing and electrical connection can be achieved at one time, and therefore the number of steps for manufacturing the electronic component device can be decreased and the production cost can be reduced.

In the method for manufacturing an electronic component device of the present invention, if pressure is applied in the direction in which the first sealing frame and the second sealing frame are in close contact with each other in the heating and bonding step, since bonding progresses while eliminating Kirkendall voids generated due to difference in diffusion coefficients of Ni and Bi during the interdiffusion between Ni and Bi proceeds, defective sealing resulting from the Kirkendall voids remaining in the bonding section can be inhibited.

In the method for manufacturing an electronic component device of the present invention, when a dimension in the width direction of at least one of the first sealing frame and the second sealing frame is larger than a dimension in the width direction of the Bi layer, the protrusion of Bi from the bonding section can be inhibited in the heating and bonding step, and consequently undesired electric short circuit due to the protrusion of Bi can be hardly generated.

In the method for manufacturing an electronic component device of the present invention, when the Bi layer is formed on any one of the first sealing frame and the second sealing frame prior to the heating and bonding step, it is possible to attain a state in which the Bi layer is interposed between the first sealing frame and the second sealing frame by just arranging the main substrate and the cover substrate in a predetermined manner in the heating and bonding step, and therefore the production steps of the electronic component device can be efficiently performed.

DETAILED DESCRIPTION OF THE INVENTION

Figure 1:
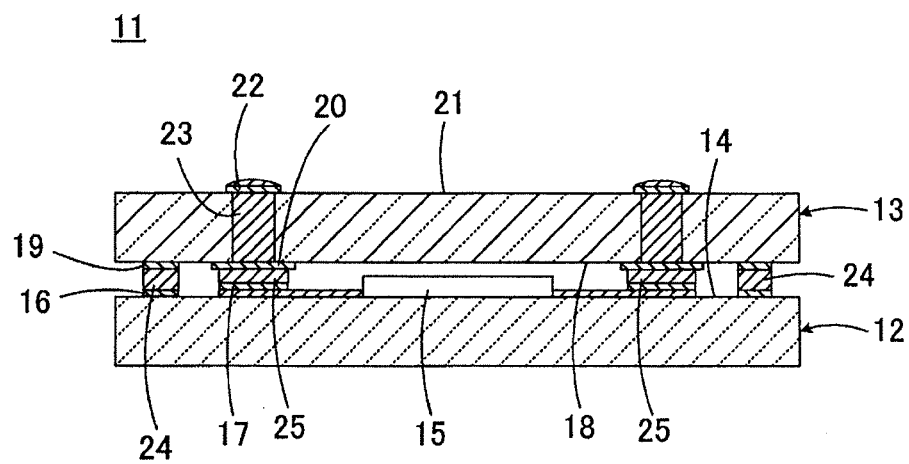
FIG. 1 is a sectional view showing a BAW filter 11 as an example of an electronic component device to which the present invention can be applied.

FIG. 1 is a sectional view showing a BAW filter 11 as an example of an electronic component device to which the present invention can be applied.

The BAW filter 11 includes a main substrate 12 composed of, for example, silicon (Si) and a cover substrate 13 composed of, for example, borosilicate glass. The main substrate 12 and the cover substrate 13 are disposed at a predetermined distance and face each other.

An electronic circuit forming section 15 (shown in a simplified manner) to form the BAW filter circuit and a first sealing frame 16 surrounding the electronic circuit forming section 15 are formed on an upper main surface 14 of the main substrate 12. Further, several first connecting electrodes 17 leading out of the electronic circuit forming section 15 are formed at a location, surrounded by the first sealing frame 16, on the upper main surface 14 of the main substrate 12.

On the other hand, a second sealing frame 19 to be bonded to the first sealing frame 16 is formed on a lower main surface 18 of the cover substrate 13. Further, several second connecting electrodes 20 corresponding to the first connecting electrodes 17 are formed at a location, surrounded by the second sealing frame 19, on the lower main surface 18 of the cover substrate 13. Several terminal electrodes 22 are formed on an upper main surface 21 of the cover substrate 13 and each of these terminal electrodes 22 is electrically connected to a second connecting electrode 40 through a through hole conductor 23 penetrating through the cover substrate 13 in a thickness direction.

In manufacturing such a BAW filter 11, the first sealing frame 16 and the second sealing frame 19 are bonded to each other. A bonding section 24 formed by this bonding is shown in FIG. 1. The first and second sealing frames 16 and 19 extend in the form of substantial rectangle, and the electronic circuit forming, section 15 is hermetically sealed when these frames are bonded to each other. Preferably, the step of electrically connecting the first connecting electrode 17 to the second connecting electrode 20 is performed concurrently with performing the step of bonding the first sealing frame 16 to the second sealing frame 19. An electrically connecting section 25 obtained by this electric connection is shown in FIG. 1, and the electrically connecting section 25 preferably has a constitution similar to that of the above-mentioned bonding section 24.

Hereinafter, several embodiments of the present invention will be described concerning the BAW filter 11 shown in FIG. 1.

Figure 2:
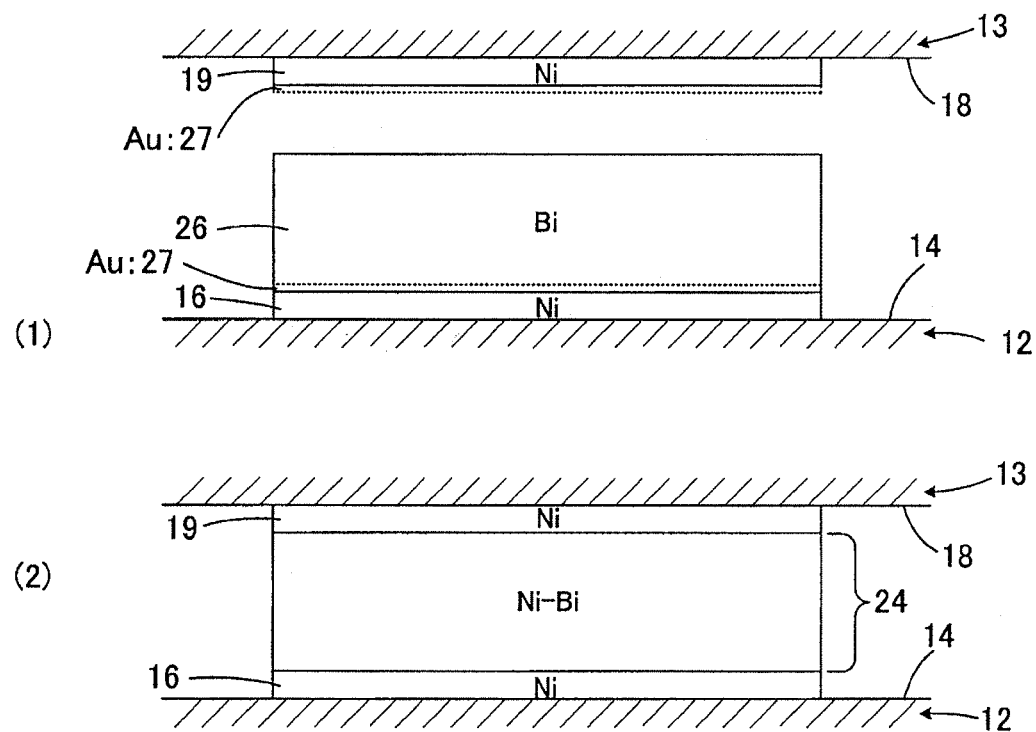
FIG. 2 is a view for illustrating the first embodiment of the present invention and an enlarged sectional view of a first sealing frame 16 and a second sealing frame 19 shown in FIG. 1, and FIG. 2(1) shows a pre-bonding state and FIG. 2(2) shows a post-bonding state of the first sealing frame 16 and the second sealing frame 19.

FIG. 2 is a view for illustrating the first embodiment of the present invention and shows an enlarged view of a part of the first sealing frame 16 and a part of the second sealing frame 19 in FIG. 1. FIG. 2(1) shows a pre-bonding state and FIG. 2(2) shows a post-bonding state of the first sealing frame 16 and the second sealing frame 19.

With reference to FIG. 2(1), both of the first sealing frame 16 and the second sealing frame 19 are composed of a Ni film predominantly composed of Ni. Each of the widths of the first and second sealing frames 16 and 19 is, for example, 50 μm. In addition, in order to enhance adhesion between the Ni film and each of the main substrate 12 and the cover substrate 13, a Ti film, but not shown, may be formed between the Ni film and the main substrate 12 and between the Ni film and the cover substrate 13.

A Bi layer 26 predominantly composed of Bi is formed on the first sealing frame 16. An oxidation resistant film 27 composed of Au is formed between the first sealing frame 16 and the Bi layer 26 as required as shown by the dotted line. On the other hand, an oxidation resistant film 27 composed of Au, for example, is formed on the second sealing frame 19 as required as shown by the dotted line. The oxidation resistant film 27 is a film for preventing the oxidation of Ni constituting the first sealing frame 16 and the second sealing frame 19, and does not contributes directly to bonding described later. The Ni film, the Bi layer 26 and the oxidation resistant film 27 composed of Au, which become layers on the first sealing frame 16 and the second sealing frame 19, are formed, for example, by vapor deposition, plating or the like.

In order to attain the structure shown in FIG. 2(2) described later, the thickness of the Ni film constituting each of the first and second sealing frames 16 and 19 is determined in such a way that a total volume of Ni supplied from the first and second sealing frames 16 and 19 is 34.60 or more of a volume of the Bi layer 26 supplied. As an example, when the thickness of the Bi layer is 5 μm, the Ni film constituting each of the first and second sealing frames 16 and 19 is set so as to be 1.73 μm or more in the total thickness.

The oxidation resistant film 27 composed of Au may have a sufficient thickness for performing the function of preventing oxidation.

In addition, in the embodiment shown in FIG. 2(1), the Bi layer 26 is formed on the first sealing frame 16, and the oxidation resistant film 27 is formed on the second sealing frame 19, but the positions of the Bi layer 26 and the oxidation resistant film 27 may be reversed. Further, the Bi layer 26 may be formed on both the first sealing frame 16 and the second sealing frame 19.

Next, the heating and bonding step for forming a bonding section 24, which bonds the first sealing frame 16 to the second sealing frame 19, is performed by heating while applying pressure in the direction in which the first sealing frame 16 and the second sealing frame 19 are in close contact with each other with the Bi layer 26 interposed between the first sealing frame 16 and the second sealing frame 19. Au constituting the oxidation resistant film 27 is dissolved in the Bi layer 26 at an initial stage of the heating and bonding step. Further, a state after performing the heating and bonding step is shown in FIG. 2(2).

The above-mentioned heating and bonding step is performed in a nitrogen atmosphere in which an oxygen concentration is, for example, 100 ppm or less. In addition, the atmosphere in the heating and bonding step may be an atmosphere of inert gas other than nitrogen, or may be a reducing atmosphere or vacuum. An application of pressure in the heating and bonding step has an effect of accelerating wetting of the second sealing frames 16 composed of the Ni film by Bi contained in the Bi layer 26, and an effect of suppressing the formation of voids at the of 8 Mpa is applied. However, when the oxide film formed on the surface of the Ni film is removed by a physical treatment such as plasma etching or a chemical treatment and then bonding is performed without being exposed to an oxidizing atmosphere, bonding can be performed without applying pressure. Further, a peak temperature in the heating and bonding step is set at 271° C. at which Bi is melted or more.

For example, when the thickness of the Bi layer 26 is 5 μm, the whole Bi layer 26 can be converted to a bonding section 24 constituted by a Ni—Bi alloy as shown in FIG. 2(2) by just retaining the layer at a peak temperature of 300° C. for at least 10 seconds. When the Ni—Bi alloy formed at the bonding section is $NiBi_3$, the bonding section 24 has a melting point of 469° C., and when the Ni—Bi alloy formed at the bonding section is $NiBi_3$, the bonding section 24 has a melting point of 654° C., and therefore it is possible to prevent the bonding section from melting, for example, in a solder reflow step. Accordingly, the hermeticity of the BAW filter is not impaired even after the solder reflow step.

In addition, the above-mentioned peak temperature and peak retention time vary in optimum values, respectively, depending on the thickness of the Bi layer 26, a temperature raising rate and a cooling rate.

Figure 8:
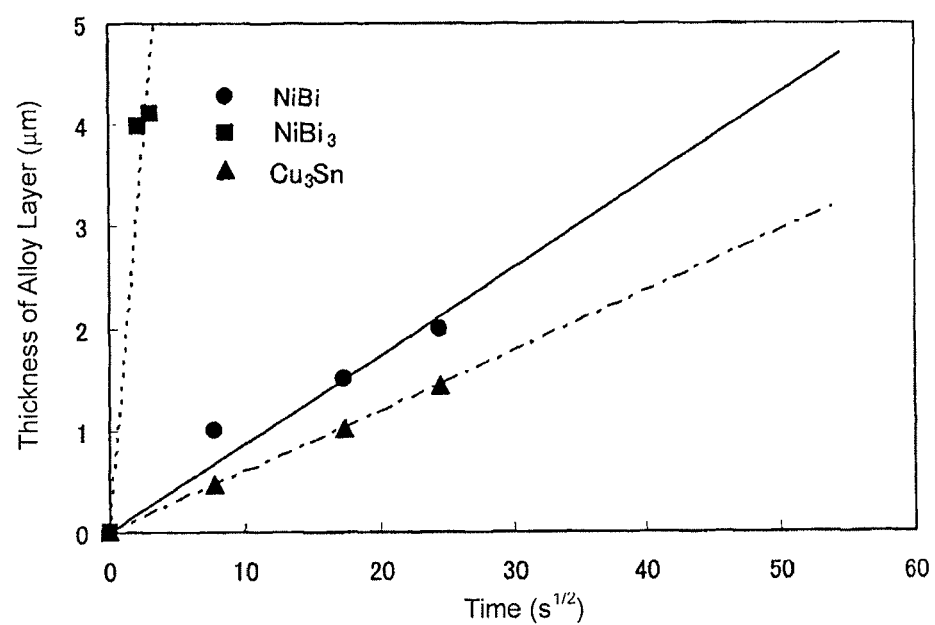
FIG. 8 is a view showing the growth rates of alloys at 300° C., and showing the growth rate of $NiBi_3$, the growth rate of NiBi and the growth rate of $Cu_3Sn$.

The alloy growth rates of $NiBi_3$ and NiBi at 300° C. of the Ni—Bi alloys are shown by "$NiBi_3$" and "NiBi" in FIG. 8. As is evident from FIG. 8, since both of $NiBi_3$ and NiBi have a rapid growth rate as compared with $Cu_3Sn$ described above, the alloy can be formed in a short time and therefore production cost can be reduced.

Further, if making growth rate comparisons between $NiBi_3$ and NiBi, the growth rate of $NiBi_3$ is more rapid than that of NiBi. As is evident from this, when $NiBi_3$ is produced at an initial stage of the heating and bonding step and then the heating and bonding step is continued, the diffusion of $NiBi_3$ and NiBi proceeds and the whole bonding section becomes NiBi. The whole bonding section 24 can be converted to NiBi by retaining the section at a peak temperature of 300° C. for 400 seconds for example when the thickness of the Bi layer 26 is 5 μm, although the result varies depending on the thickness of the Bi layer 26, a temperature raising rate and a cooling rate.

Hardness and elastic modulus of $NiB_3$ was compared with those of NiBi, and consequently $NiB_3$ had a hardness of 1300 $N/mm^2$ and an elastic modulus of 50 GPa and NiBi had a hardness of 3650 $N/mm^2$ and an elastic modulus of 100 GPa, and therefore both of the hardness and the elastic modulus of NiBi are larger than those of $NiB_3$. Since hardness is approximately proportional to tensile strength, it is said that NiBi is a material tougher than $NiB_3$.

Figure 3:
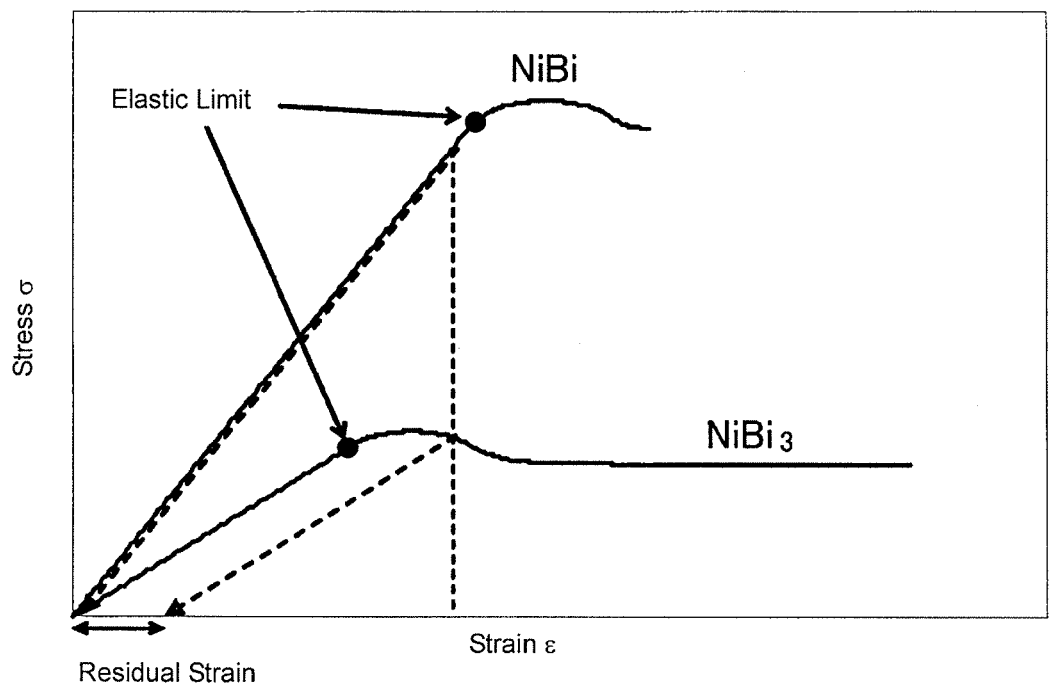
FIG. 3 is a view showing stress-strain characteristics of $NiBi_3$ and NiBi.

FIG. 3 shows stress-strain characteristics of $NiBi_3$ and NiBi. As shown in FIG. 3, an elastic region of NiBi is broader than that of $NiB_3$.

Accordingly, since $NiBi_3$ has a narrower elastic region, $NiBi_3$ is deformed plastically even if the same strain is applied, and a permanent strain may remain even when stress is 0. Therefore, when repeated stress is applied in a thermal impact test or the like, the permanent strain may be accumulated, resulting in fracture.

On the other hand, since NiBi has a broader elastic region, NiBi is deformed elastically even if strain which causes a plastic deformation in $NiB_3$ is applied to NiBi, and NiBi is returned to an original state if stress is 0 and a permanent strain does not remain. Therefore, NiBi stores most of a load generated due to thermal stress as elastic energy to hardly cause a plastic strain and is highly resistant to plastic fatigue failure due to repeated stress.

As described above, when the bonding section 24 is formed so as to be constituted by NiBi, the bonding section 24 can be highly resistant to plastic fatigue failure due to repeated stress.

On the other hand, if the bonding section 24 is formed so as to contain $NiBi_3$, the heating holding time in the heating and bonding step can be shortened.

Figure 4:
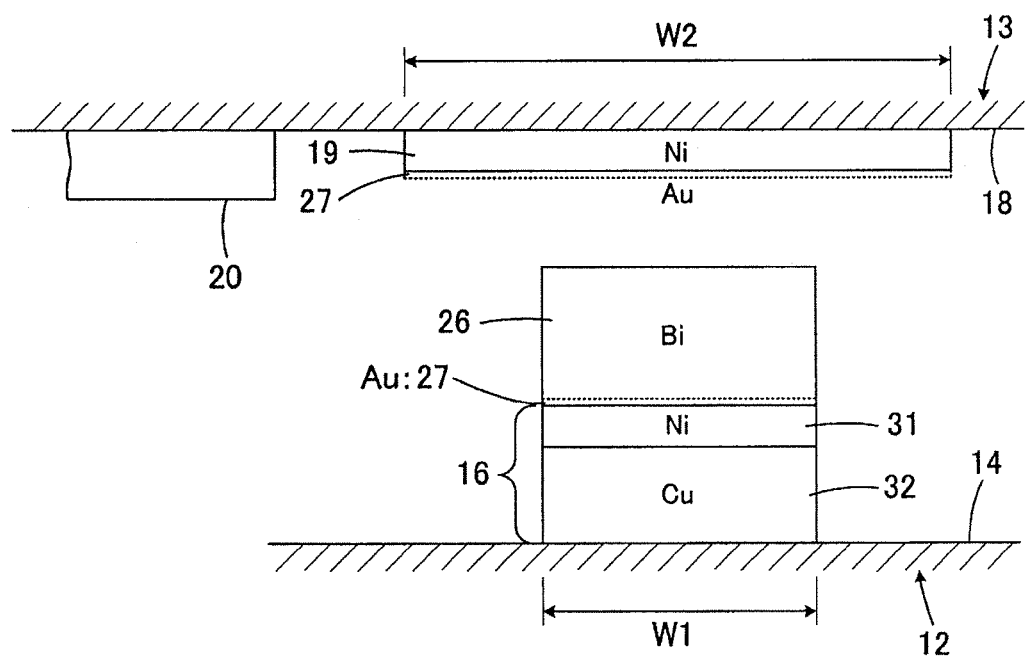
FIG. 4 is a view corresponding to FIG. 2(1) for illustrating the second embodiment of the present invention.

FIG. 4 is a view corresponding to FIG. 2(1) for illustrating the second embodiment of the present invention. In FIG. 4, the same reference symbols are given to elements corresponding to the elements shown in FIG. 2, and overlapped descriptions are omitted.

The second embodiment has a feature that a dimension W2 in the width direction of the second sealing frame 19 is larger than a dimension W1 in the width direction of the first sealing frame 16. This is a configuration for preventing Bi constituting the Bi layer 26 from protruding from the first sealing frame 16 due to the pressurization in the heating and bonding step to cause electric short circuit between the protruded Bi and the connecting electrode 20, for example. As an example, when the dimension W2 in the width direction of the second sealing frame 19 is 50 μm, the dimension W1 in the width direction of the first sealing frame 16 is set at about 15 to 25 μm.

In addition, in the embodiment shown in FIG. 4, the first sealing frame 16, a Cu film 32 predominantly composed of Cu is formed in a thickness of 7.5 μm or more, for example, including the thickness of Ni film by a thick film formation technology before a Ni film 31 is formed. By forming a relatively thick Cu film 32 as described above, an effect of preventing the protrusion of Bi is enhanced. Further, by forming the thick Cu film 32, it can be expected to lessen thermal stress generated due to difference in coefficients of thermal expansion between the first member and the second member. However, if such an advantage is not particularly desired, the Ni film 31 may be formed directly on the main substrate 12 omitting the Cu film 32.

In FIG. 4, the dimension W2 in the width direction of the second sealing frame 19 is larger than the dimension WI in the width direction of the first sealing frame 16, but conversely, the dimension W1 in the width direction of the first sealing frame 16 may be larger than the dimension W2 in the width direction of the second sealing frame 19. However, a dimension in the width direction of the Bi layer 26 is matched with smaller one of the dimensions W1 and W2 in the width direction. The Bi layer 26 may be formed on any of the first sealing frame 16 and the second sealing frame 19.

Further, when Bi protrudes as described above, Bi tends to cohere in corner sections of the sealing frames 16 and 19, and therefore the corner sections are preferably formed into a circular arc shape in order to suppress such cohesion.

The above-mentioned constitution in the bonding section 24 which bonds the first sealing frame 16 to the second sealing frame 19 can be applied similarly to the electrically connecting section 25 which electrically connects the first connecting electrode 17 to the second connecting electrode 20. In this case, if the connecting step of electrically connecting the first connecting electrode 17 to the second connecting electrode 20 is performed concurrently with performing the heating and bonding step on the first sealing frame 16 and the second sealing frame 19, sealing and electrical connection can be achieved at one time, and therefore, the number of steps for manufacturing the BAW filter 11 can be decreased and the production cost can be reduced.

Further, the constitution for suppressing the protrusion of Bi, described with reference to FIG. 4, can also be applied to the connecting electrodes 17 and 20 as described above.

Further, the present invention can be applied not only to the BAW filter 11 including the main substrate 12 provided with the first sealing frame 16 and the cover substrate 13 provided with the second sealing frame 19, but also to other electronic component devices including similar main substrates and cover substrates.

In the method for manufacturing an electronic component device of the present invention, a first collective substrate which gives a plurality of main substrates, and a second collective substrate which gives a plurality of cover substrates are prepared, and the heating and bonding step may be performed in a state of the first collective substrate and the second collective substrate. In this case, after the heating and bonding step, a step, in which the first collective substrate and the second collective substrate are divided into each electronic component device unit, is further performed. In the heating and bonding step, it is preferable to use a chamber in which an inert gas can be introduced or a vacuum atmosphere can be produced while housing the first and second collective substrates. In accordance with such a manufacturing method, since a plurality of electronic component devices can be manufactured by one operation, the productivity improvements of the electronic component device can be expected.

Figure 5:
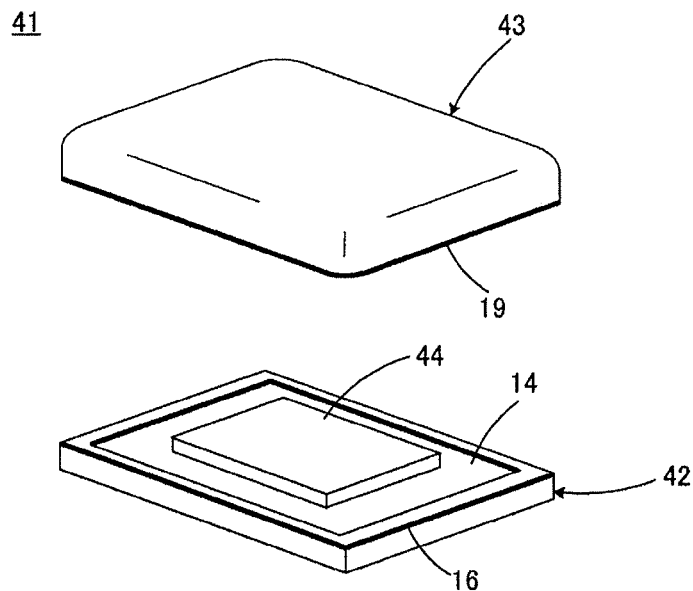
FIG. 5 is a view for illustrating the third embodiment of the present invention and a perspective view showing a main substrate 42 and a cover substrate 43 included in an electronic component device 41 separately.
Figure 6:
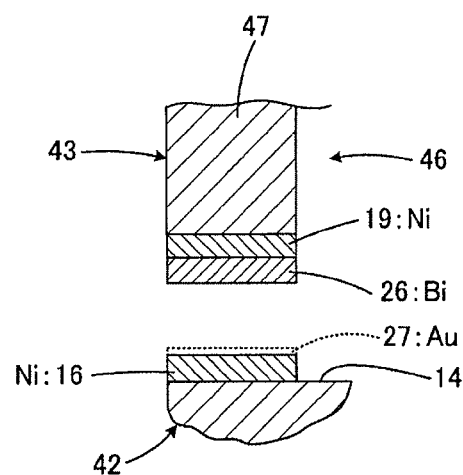
FIG. 6 is an enlarged sectional view of a bonding section of the main substrate 42 and the cover substrate 43 shown in FIG. 5.
Figure 7:
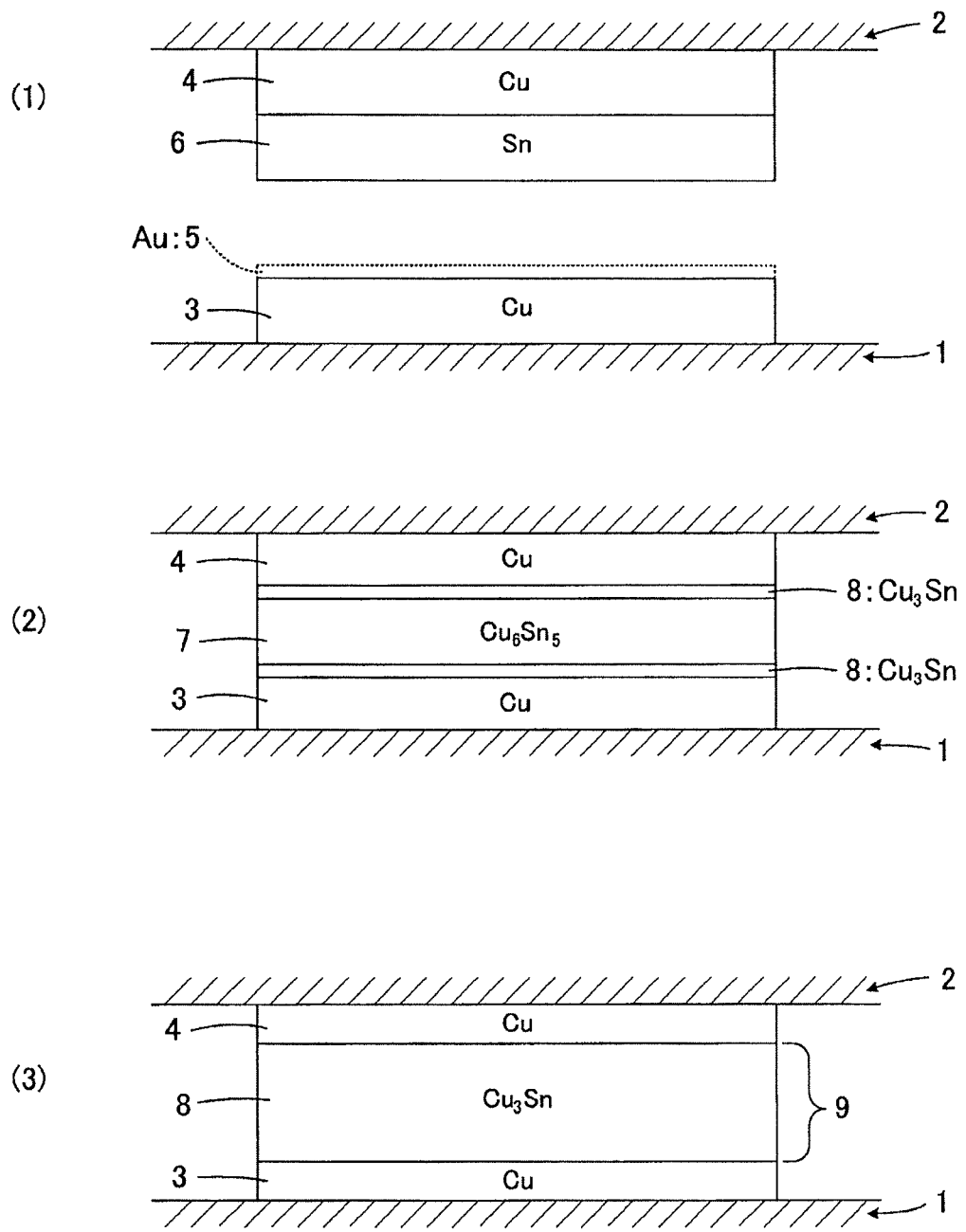
FIG. 7 is a sectional view showing a bonding step for illustrating a conventional art of interest to the present invention.

Further, a cap-shaped substrate shown in FIG. 5 may be used for the cover substrate. FIG. 5 is a view for illustrating the third embodiment of the present invention and a perspective view showing a main substrate 42 and a cover substrate 43 included in an electronic component device 41 separately. FIG. 6 is an enlarged sectional view of a bonding section of the main substrate 42 and the cover substrate 43 shown in FIG. 5. In FIG. 5, the same reference symbols are given to elements corresponding to the elements shown in FIG. 2(1), and overlapped descriptions are omitted.

On an upper main surface 14 of the main substrate 42, an element 44 to form a required circuit is mounted and the first sealing frame 16 surrounding the element 44 is formed. In addition, a connecting conductor to be lead out of the element 44 is omitted in FIG. 6.

On the other hand, a recessed section 46 (refer to FIG. 6) is formed on a lower main surface of the cap-shaped cover substrate 43, and the second sealing frame 19 to be bonded to the first sealing frame 16 is formed on a lower side of a peripheral section 47 which defines the recessed section 46.

With reference to FIG. 6, both of the first sealing frame 16 and the second sealing frame 19 are constituted by a Ni film predominantly composed of Ni.

The oxidation resistant film 27 composed of Au is formed on the first sealing frame 16 as required. On the other hand, the Bi layer 26 predominantly composed of Bi is formed on the second sealing frame 19.

In addition, an arrangement of the oxidation resistant film 27 on the first sealing frame 16 and the Bi layer 26 on the second sealing frame 19 and the like may be modified as other embodiments. For example, the Bi layer 26 may be formed on the main substrate 42 side.

Further, also in this embodiment, the main substrate 42 is prepared in a state of a collective substrate constituting a plurality of main substrates 42, and the main substrate 42 may be bonded to the cover substrates 43 in the state of a collective substrate, and then divided into each main substrate 42, or may be bonded to the cover substrate 43 in a state of each main substrate 42.

DESCRIPTION OF REFERENCE SYMBOLS

11 BAW filter (electronic component device)
12, 42 main substrate
13, 43 cover substrate
15 electronic circuit forming section
16 first sealing frame
17 first connecting electrode
19 second sealing frame
20 second connecting electrode
24 bonding section
25 electrically connecting section
26 Bi layer
41 electronic component device

The invention claimed is:

1. An electronic component device comprising:
   a main substrate provided with an electronic circuit forming section and a first sealing frame surrounding said electronic circuit forming section on a surface of the main substrate;
   a cover substrate provided with a second sealing frame on a surface of the cover substrate; and
   a bonding section between said first sealing frame and said second sealing frame, wherein
   each of said first sealing frame and said second sealing frame comprises a Ni film predominantly composed of Ni, and wherein
   said bonding section comprises a Ni—Bi alloy predominantly composed of Ni and Bi.

2. The electronic component device according to claim 1, wherein said Ni—Bi alloy is NiBi.

3. The electronic component device according to claim 1, wherein said Ni—Bi alloy contains $NiBi_3$.

4. The electronic component device according to claim 1, further comprising:
   a first connecting electrode on said surface of said main substrate and surrounded by said first sealing frame;
   a second connecting electrode on said surface of said cover substrate and surrounded by said second sealing frame; and
   an electrically connecting section electrically connecting said first connecting electrode to said second connecting electrode, said electrically connecting section comprising a Ni—Bi alloy predominantly composed of Ni and Bi.

5. The electronic component device according to claim 1, further comprising an oxidation resistant film on a surface of at least one of said first sealing frame and said second sealing frame.

6. The electronic component device according to claim 5, wherein the oxidation resistant film is Au.

7. The electronic component device according to claim 1, wherein a thickness of the Ni film constituting each of the first and second sealing frames is set such that a total volume of Ni supplied from the first and second sealing frames is 34.6% or more of a volume of a Bi layer used to form the bonding section.

8. The electronic component device according to claim 1, wherein a width of the first sealing frame is different than a width of the second sealing frame.

9. The electronic component device according to claim 8, wherein a width of a Bi layer used to form the bonding section is matched to a smallest width sealing frame of the first and second sealing frames.

10. The electronic component device according to claim 1, further comprising a metal film between at least one of (1) the first sealing frame and the main substrate and (2) the second sealing frame and the cover substrate.

11. The electronic component device according to claim 10, wherein the metal film is Cu.

\* \* \* \* \*